US012235666B2

(12) United States Patent
Tiruvamattur et al.

(10) Patent No.: US 12,235,666 B2
(45) Date of Patent: Feb. 25, 2025

(54) FAST SOFT-START REFERENCE CURRENT CONTROLLED BY SUPPLY RAMP

(71) Applicant: Texas Instruments Incorporated, Dallas, TX (US)

(72) Inventors: Venkateswarlu Ramaswamy Tiruvamattur, Karnataka (IN); RamaKrishna Ankamreddi, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 229 days.

(21) Appl. No.: 17/806,240

(22) Filed: Jun. 9, 2022

(65) Prior Publication Data

US 2022/0397925 A1 Dec. 15, 2022

(30) Foreign Application Priority Data

Jun. 10, 2021 (IN) .............................. 202141025761

(51) Int. Cl.
*G05F 1/567* (2006.01)
*G05F 1/46* (2006.01)
(Continued)

(52) U.S. Cl.
CPC .............. *G05F 1/567* (2013.01); *G05F 1/468* (2013.01); *G05F 3/262* (2013.01); *H03F 3/45183* (2013.01)

(58) Field of Classification Search
CPC ............ G01R 19/165; G01R 19/16504; G01R 19/16509; G01R 19/16514;
(Continued)

(56) References Cited

U.S. PATENT DOCUMENTS 8,344,713 B2   1/2013  Shrivas et al.
9,513,646 B2 * 12/2016  Lan .......................... G05F 1/565
(Continued)

OTHER PUBLICATIONS

Falin, Jeff, "Soft-start circuits for LDO linear regulators," Analog and Mixed-Signal Products, Analog Applications Journal, 3Q (2003). pp. 10-13.

(Continued)

*Primary Examiner* — Sean Kayes
*Assistant Examiner* — Nusrat Quddus
(74) *Attorney, Agent, or Firm* — Charles F. Koch; Frank D. Cimino (57) ABSTRACT

Techniques for controlling a low-dropout (LDO) voltage regulator. In an example, an LDO voltage regulator circuit includes an amplifier having an output coupled to a transistor. First and second inputs of the amplifier are coupled to a power supply node via first and second resistors, respectively. The transistor gate is coupled to the amplifier output, the transistor source is coupled to the second input of the amplifier, and the transistor drain is coupled to a reference voltage node. The second resistor is variable based on the amplifier output and a reference voltage from the reference voltage node. In an example, the reference voltage node is connectable to ground via a reference resistor connected in parallel with a noise-filtering capacitor, which causes a reference current to flow through the transistor. The reference current is adjusted based on the drain-to-source voltage of the transistor.

25 Claims, 8 Drawing Sheets (51) Int. Cl.
*G05F 3/26* (2006.01)
*H03F 3/45* (2006.01)

(58) Field of Classification Search
CPC ........ G01R 19/16519; G01R 19/16523; G01R 19/16528; G01R 19/16533; G01R 19/16538; G01R 19/16542; G01R 19/16547; G01R 19/16552; G01R 19/16557; G01R 19/16561; G01R 19/16566; G01R 19/16571; G01R 19/16576; G01R 19/1658; G01R 19/16585; G01R 19/1659; G01R 19/16595; G01R 19/17; G05F 1/462; G05F 1/465; G05F 1/468; G05F 1/56; G05F 1/575; G05F 1/562; G05F 1/565; G05F 1/567; G05F 1/569; G05F 1/571; G05F 1/573; G05F 1/5735; G05F 3/00–30; H03F 3/45183
See application file for complete search history.

(56) References Cited

U.S. PATENT DOCUMENTS

| | | | | |
|---|---|---|---|---|
| 10,254,778 | B1 * | 4/2019 | Sambucco | G05F 1/565 |
| 10,802,521 | B2 * | 10/2020 | Qiu | G05F 1/575 |
| 11,402,456 | B2 * | 8/2022 | Fortuny | G01R 1/203 |
| 2002/0079873 | A1 * | 6/2002 | Matsushita | G05F 1/5735 |
| | | | | 323/274 |
| 2007/0216383 | A1 * | 9/2007 | Al-Shyoukh | G05F 1/468 |
| | | | | 323/280 |
| 2009/0256540 | A1 * | 10/2009 | Yang | G05F 1/575 |
| | | | | 323/282 |
| 2011/0156672 | A1 * | 6/2011 | Gakhar | H02H 9/001 |
| | | | | 323/280 |
| 2012/0146595 | A1 * | 6/2012 | Wong | G05F 1/56 |
| | | | | 323/265 |
| 2012/0187930 | A1 * | 7/2012 | Williams | G05F 1/5735 |
| | | | | 323/273 |
| 2013/0191652 | A1 * | 7/2013 | Seok | G06F 21/755 |
| | | | | 713/300 |
| 2016/0147239 | A1 * | 5/2016 | Yan | G05F 1/575 |
| | | | | 323/280 |
| 2017/0090494 | A1 * | 3/2017 | Cui | G05F 1/562 |
| 2020/0064875 | A1 * | 2/2020 | Gonapati | G05F 1/573 |
| 2020/0278710 | A1 | 9/2020 | Sankman et al. | |
| 2021/0080985 | A1 | 3/2021 | Bhat | |

OTHER PUBLICATIONS

Day, Michael, "Understanding Low Drop Out (LDO) Regulators," Texas Instruments. (2006). pp. 9-1 to 9-6.

* cited by examiner

FAST SOFT-START REFERENCE CURRENT CONTROLLED BY SUPPLY RAMP

CROSS-REFERENCE TO RELATED APPLICATION

This application claims the benefit of and priority to India (IN) Provisional Patent Application No. 202141025761 filed on Jun. 10, 2021, which is incorporated herein by reference in its entirety.

TECHNICAL FIELD

This description relates to regulated power supplies, and in particular, to low-dropout (LDO) voltage regulators.

BACKGROUND

The direct current (DC) output voltage provided by a standard power supply to a load can vary due to any number of factors such as transient conditions, environmental conditions, and changing load conditions. In such cases, a linear voltage regulator can be coupled between the power supply and the load and used to provide a regulated DC output voltage to the load, thus allowing that regulated DC output voltage to be independent of the DC input supply voltage. In this manner, the output voltage remains unaffected by abrupt or otherwise transient changes in the input supply voltage and the load current.

One type of linear regulator is a low-dropout (LDO) voltage regulator which generally includes a stable reference voltage (e.g., bandgap voltage reference), a differential amplifier (sometimes just called an amplifier), and a pass element (e.g., a power field effect transistor, or power FET). One benefit of LDO regulators relative to switching-type linear regulators is better headroom, in that and LDO can regulate the output voltage even when the input supply voltage is very near the output voltage (e.g., within 1 volt or less). Responsive to the input supply voltage dropping below the dropout mode threshold voltage, the regulator enters dropout mode and ceases to regulate against further reductions in input supply voltage. So, during dropout mode, the output voltage generally equals the input supply voltage minus the voltage drop across the pass element. Dropout mode ends responsive to the input supply voltage ramping to a level that is above the dropout mode threshold.

LDO regulators may also be configured with a soft-start function. In general, soft-start reduces stress on the input power supply by reducing capacitive in-rush current on start-up of the regulator, and when transitioning out of dropout mode. However, a number of non-trivial issues remain with soft-starting an LDO regulator.

SUMMARY

Techniques are described herein for controlling a low-dropout (LDO) voltage regulator.

In an example, an LDO voltage regulator circuit includes an amplifier coupled to a transistor. The amplifier has a first input, a second input, and an output. The first input of the amplifier is coupled to a power supply terminal via a first resistor, and the second input of the amplifier is coupled to the power supply terminal via a second resistor. The transistor has a gate, a source, and a drain. The gate is coupled to the output of the amplifier, the source is coupled to the second input of the amplifier and the second resistor, and the drain is coupled to a reference voltage terminal. Resistance of the second resistor at the second input of the amplifier is variable based on a first signal from the output of the amplifier and a second signal from the reference voltage terminal.

Another example is an LDO voltage regulator circuit that includes a current source, a reference voltage circuit, and a dropout detection circuit. The current source is configured to provide a bias current. The reference voltage circuit includes a transistor that is gated by an output signal of an amplifier configured with an input resistor. The reference voltage circuit is configured to provide a reference current based on the input resistor and the bias current. The dropout detection circuit is configured to modulate resistance of the input resistor based on the output signal of an amplifier. In one such case, the reference current is passed through a reference resistor to provide a reference voltage, and the dropout detection circuit is further configured to modulate the resistance of the input resistor based on the reference voltage.

Another example is a dropout detection circuit for an LDO voltage regulator. The dropout detection circuit includes a first transistor, a second transistor, a third transistor, a fourth transistor, and a proportional to absolute temperature (PTAT) current source. The first transistor has a first gate, a first source, and a first drain. The first gate is coupled to a reference voltage terminal, and the first drain is coupled to a power supply terminal. The second transistor has a second gate, a second source, and a second drain. The second gate is coupled to an amplifier output terminal, and the second source is coupled to the first source via a first resistor configured to pass a first current. The third transistor has a third gate, a third source, and a third drain. The third drain is coupled to the third gate and a second resistor, and the third source is coupled to the first drain. The fourth transistor has a fourth gate, a fourth source, and a fourth drain. The fourth gate is coupled to the third drain via the second resistor, the fourth source is coupled to the power supply terminal via a third resistor, and the fourth drain is coupled to an amplifier input terminal, such that the fourth transistor can vary resistance of an amplifier input resistor responsive to signal at the fourth gate. The PTAT current source is coupled to the first drain and the third source and configured to provide a second current to which the first current is compared. In one such case, a differential current that results from comparing the first and second currents causes the resistance of the amplifier input resistor to change in value.

Another example is a method for controlling an LDO voltage regulator configured to generate a reference current. Responsive to an input supply voltage having a ramp rate that is greater than a first threshold that is indicative of a fast ramp rate, the method includes adjust the reference current to a first fast soft-start current. Responsive to the input supply voltage having a ramp rate that is less than a second threshold that is indicative of a slow ramp rate, the method includes adjust the reference current to a second fast soft-start current. The second fast soft-start current is less than the first fast soft-start current. Responsive to the input supply voltage having a ramp rate that is between the first threshold and the second threshold, the method includes adjust the reference current to an intermediate fast soft-start current. The intermediate fast soft-start current is between the first fast soft-start current and the second fast soft-start current. In one such case, the LDO voltage regulator includes a reference voltage generator circuit having a switching element (e.g., pass element, such as a field effect transistor or so-called passFET) that is responsive to an output signal of an amplifier, and in operation, the switching element has a drain-to-source voltage (Vds), and the reference current is adjusted based on Vds.

DETAILED DESCRIPTION

Techniques are described herein for controlling a low-dropout (LDO) voltage regulator. In an example, an LDO voltage regulator circuit includes reference voltage circuit coupled to a dropout detection circuit. The reference voltage circuit includes an amplifier having an output coupled to a transistor. First and second inputs of the amplifier are coupled to a power supply node (or terminal, used interchangeably) via first and second resistances, respectively. The transistor gate is coupled to the amplifier output, the transistor source is coupled to the second input of the amplifier, and the transistor drain is coupled to a reference voltage node. The dropout detection circuit is configured to vary the second resistance based on the amplifier output and a reference voltage from the reference voltage node, which in turn adjusts the reference current. In an example, the reference voltage node is connectable to ground via a resistor connected in parallel with a capacitor, which causes a reference current to flow through the transistor. The capacitor can be used to filter reference noise generated internally to the LDO.

General Overview

As described above, a number of non-trivial issues remain with soft-starting an LDO voltage regulator. In more detail, a low-noise LDO voltage regulator capable of providing a relatively low output voltage range and a consistent noise profile across that range may have a unity follower configuration and use an external reference resistor (RExt) and an external capacitor (CExt) to filter reference noise. During operation, an internally-generated reference current (IRef) is pushed through resistor RExt, which generates a reference voltage (VRef) which in turn sets the output voltage of the LDO voltage regulator. Because capacitor CExt can be relatively large, particularly with respect to ultra-low-noise LDOs (e.g., in the microfarad range, such as 4.7 microfarads), it increases the start-up time of the LDO. As such, the reference current IRef is shifted to higher current during soft-start. This higher reference current is referred to as a fast soft-start current (IFss) and helps to reduce the start-up time with a higher ramp rate on capacitor CExt. To limit the overshoot on the reference voltage VRef while the regulator is coming out of dropout, a dropout detector circuit can be used to disconnect the fast soft-start current IFss responsive to the regulator output voltage reaching a given voltage threshold, such as 90% of the target output voltage. Such an approach may work well in cases where the input supply voltage ramp rate is very slow during the soft-start period. However, when the input supply voltage has different ramp rates (slow to intermediate), the dropout detection circuit may digitally switch the reference current between low and high currents, which may cause an unintended staircase waveform on the reference voltage at those supply ramp rates. This staircase in turn may manifest on the LDO regulator output, and may not be acceptable in some applications.

Accordingly, techniques are described herein for reducing the staircase behavior on the reference voltage or output of an LDO voltage regulator. In an example, a dropout detector circuit is configured to, during start-up of the regulator, adjust fast soft-start current IFss according to the ramp rate of the input supply voltage. For instance, in one such case, the reference current is adjusted to a maximum fast soft-start current (IFss_max) responsive to the ramp rate of the input supply voltage being relatively high. The ramp rate can be assessed against a first threshold that is indicative of a fast ramp rate. In a similar fashion, the reference current is adjusted to a minimum fast soft-start current (IFss_min, also referred to as Dropout) responsive to the ramp rate of the input supply voltage being relatively low. In this case, the ramp rate can be assessed against a second threshold that is indicative of a slow ramp rate. For ramp rates between the first and second thresholds, the reference current is adjusted to an intermediate soft-start current (IFss_mid) that is between IFss_min and IFss_max. The minimum and maximum fast soft-start currents can vary from one example to the next, as can the first and second thresholds.

The techniques can work in conjunction with standard or proprietary LDO voltage regulator designs, as modified herein to adjust the reference current based on the ramp rate of the input supply voltage. In an example, an example LDO voltage regulator includes reference voltage circuit coupled to a dropout detection circuit. The reference voltage circuit includes an amplifier coupled to a transistor. In one such case, the non-inverting input of the amplifier is coupled to a power supply node via a first resistance (R1), and the inverting input of the amplifier is coupled to the power supply node via a second resistance (R2). A bias current applied to the non-inverting input (e.g., via a stable current source, IBias) causes a reference current to generated. The reference current can be computed as: IBias*[R1/R2]. In an example, and as further described below, the second resistance (R2) can be varied, by the dropout detection circuit, based on the dynamically detected ramp rate of the input voltage supply, which in turn adjusts the reference current.

The ramp rate is assessed based on the transistor's region of operation (e.g., saturation and triode regions). In more detail, the transistor gate is coupled to the output of the amplifier, the transistor source is coupled to the inverting input of the amplifier, and the transistor drain is coupled to a reference voltage node. A reference resistor and a noise-filtering capacitor are connected in parallel between the reference voltage node and ground. The reference resistor and capacitor may be external to the LDO. During operation, the amplifier drives the transistor gate and delivers the reference current to the reference resistor thereby generating a reference voltage for the LDO. The dropout detection circuit is configured to receive both the reference voltage and transistor gate potential. These two voltages allow the dropout detection circuit to detect deep dropout mode (e.g., Vds<Vdsat, or triode region of the transistor, which may represent the first threshold indicative of a slow ramp rate) to limit the reference current to a relatively low value (e.g., IFss_min or IDropout), or to scale the reference current to an intermediate value (e.g., IFss_mid) if the transistor is in partial dropout mode, or to set the reference current to a relatively high value (e.g., IFss_max) if the transistor is in deep saturation mode (e.g., Vds>Vdsat, or saturation region of the transistor, which may represent the second threshold indicative of a fast ramp rate).

In this manner, a dynamically adjustable fast soft-start current IFss is thus provisioned by assessing the region of operation of the transistor as driven by the amplifier. This assessment can be made based on the Vds potential drop of the transistor as the ramp rate of the input power supply changes. The fast soft-start current IFss has a minimum value IFss_min and a maximum value IFss_max, and can vary between IFss_min and IFss_max depending on the ramp rate of the input power supply. So, in one such example, the amplifier generates the reference current using an internal bias current (IBias) and a resistor (R2) along with the transistor, whose gate is regulated to deliver the reference current. The value of resistor (R2) is adjusted by detecting the transistor's region of operation which is indicative of the ramp rate of the input supply voltage. For example, the value of resistor (R2) is adjusted based on the output of the amplifier (transistor gate voltage) and the reference voltage. The reference current during soft-start is adjusted accordingly.

After power-up is complete, the LDO leaves fast soft-start mode and continues in normal regulation mode. However, if the LDO subsequently enters a dropout condition, then the input supply voltage may start ramping up from the dropout condition in a relatively fast manner. In this situation, it may be desirable to have a higher soft-start current to quickly bring the output voltage to regulated value. So, in one example such case, the dropout detection circuit is configured to dynamically detect the fast ramp rate (based on the transistor gate and drain voltages, as described above) and set the reference current to a relatively high current (e.g., IFss_max, such as 2 mA), and then modulate the reference current towards the relatively low current (e.g., IFss_min, such as 150 microamps (µA)), thereby reducing the overshoot as the LDO voltage regulator recovers from the transient dropout condition.

Circuit Architecture

Figure 1:
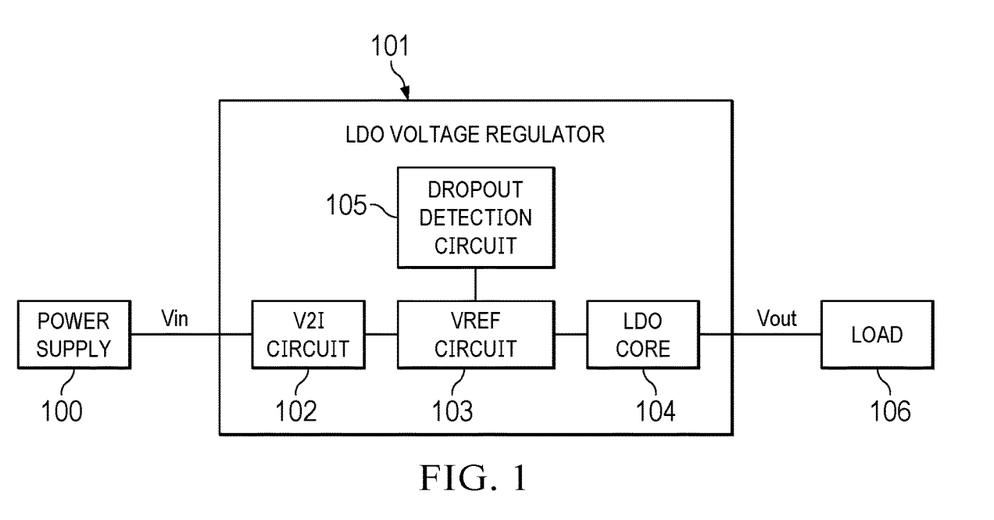
FIG. 1 illustrates a block diagram of a system that uses a low-dropout (LDO) voltage regulator, in an example.

FIG. 1 illustrates a block diagram of a system that uses a low-dropout (LDO) voltage regulator, in an example. As shown, the system includes an LDO voltage regulator 101 coupled between a power supply 100 and a load 106. In operation, the power supply 100 provides an input supply voltage Vin to the LDO voltage regulator 101, which in turn provides a regulated output voltage Vout to the load 106. In general, the LDO voltage regulator 101 is configured with a fast soft-start function that allows for ramping to the desired output voltage Vout in a relatively short time with no or low overshoot.

The power supply 101 can be any number of power supplies, such as an alternate current to direct current (AC-DC) converter or a DC-DC converter or a battery (rechargeable, or not), or a combination of such supplies. More generally, the power supply 101 can be any power source or circuit having a DC voltage output that can vary due to load conditions or some other reason. The input supply voltage Vin can vary from one example to the next, but in some examples is in the range of 3.5 volts to 35 volts (e.g., 5 volts or 24 volts).

The load 106 can be any circuit or combination of circuits for which a regulated voltage supply is needed, and can vary from one embodiment to the next. In some examples, load 106 includes digital and/or analog circuitry configured to perform a function (e.g., processing, system control, logical computation, storage, etc.) and/or provide an output (e.g., data, control signals, commands, visual displays, aural presentations, etc.). More generally, the load 106 can be any circuit or apparatus or system or device that uses regulated power.

As further shown in FIG. 1, the LDO voltage regulator 101 includes a voltage-to-current converter (V2I) circuit 102, a reference voltage (VRef) circuit 103, a dropout detection circuit 104, and an LDO core 105. As described above, the LDO voltage regulator 101 is configured with a fast soft-start function. The fast soft-start current can dynamically adjust, and thus can accommodate a wide range of capacitor values (e.g., 100 nanofarads to 10 microfarads) suitable for filtering reference noise at the reference voltage node of VRef circuit 103. Although the absolute values can vary from one embodiment to the next, in some examples, the fast soft-start current ranges from a minimum or otherwise relatively low current (e.g., such as 150 µA) to a maximum or otherwise high current (e.g., such as 2 mA).

Figure 3:
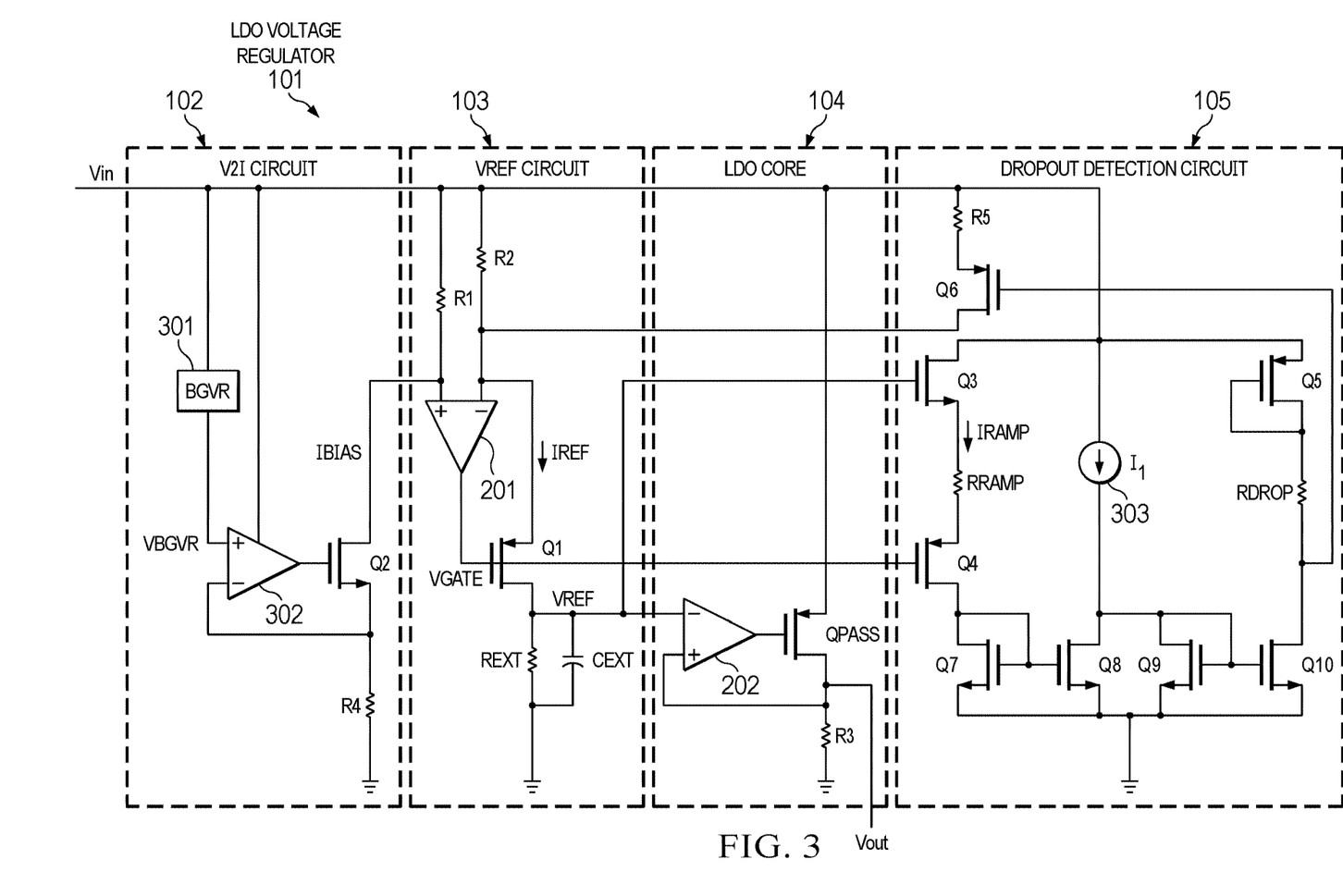
FIG. 3 illustrates a schematic diagram of an LDO voltage regulator, in another example.

The V2I circuit 102 is configured to provide a stable bias current to the VRef 103, and can be any number of voltage-to-current converter topologies. The bias current is used by the VRef circuit 103 to generate a reference current, which in turn is used to generate a reference voltage used by the LDO core 104. One example of a V2I circuit 102 is shown in FIG. 3 and described below. More generally, the V2I circuit 102 can be implemented with any current source configurations capable of providing a stable bias current to the VRef circuit 103.

Figure 2:
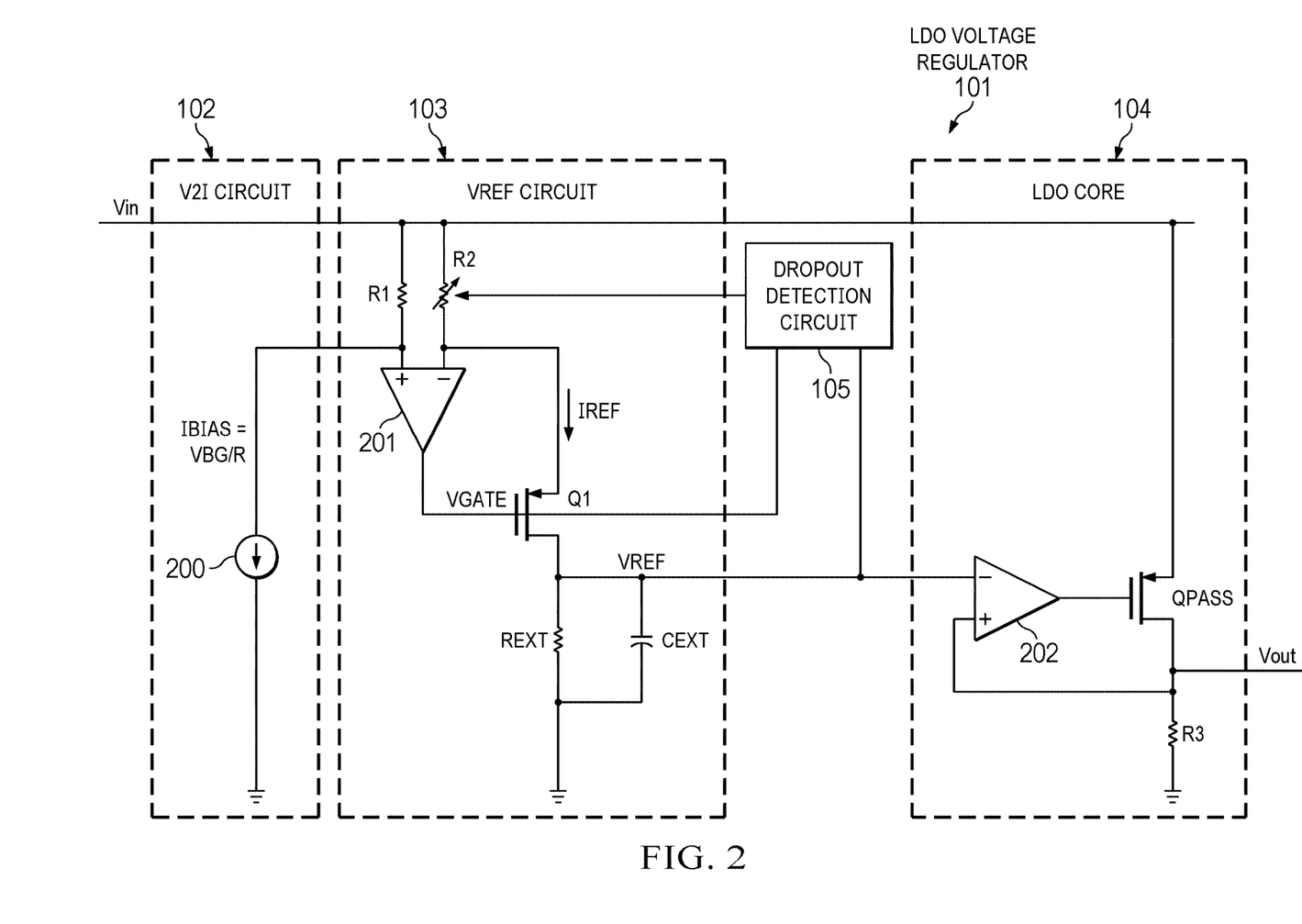
FIG. 2 illustrates a schematic diagram of an LDO voltage regulator, in an example.

The VRef circuit 103 is configured to generate a reference voltage for the LDO core 104. In an example, the VRef circuit 103 includes an amplifier and a transistor (such as a passFET or other switching element). The transistor is gated or otherwise controlled by an output signal of the amplifier. The amplifier is configured with first and second input resistances on its inverting and non-inverting inputs, respectively, which in conjunction with the bias current provided by the V2I circuit 102 effectively determine the reference current. The reference current generated by the amplifier is passed through the transistor and a reference resistor (which may be external to the VRef circuit 103), which in turn generates the reference voltage that is provided to the LDO core 104. One example of a VRef circuit 103 is shown in FIGS. 2 and 3 and described below. More generally, the VRef circuit 103 can be implemented with any reference voltage generator circuit configurations having fast soft-start current that can be modulated by the dropout detection circuit 105 during soft-start.

Figure 4:
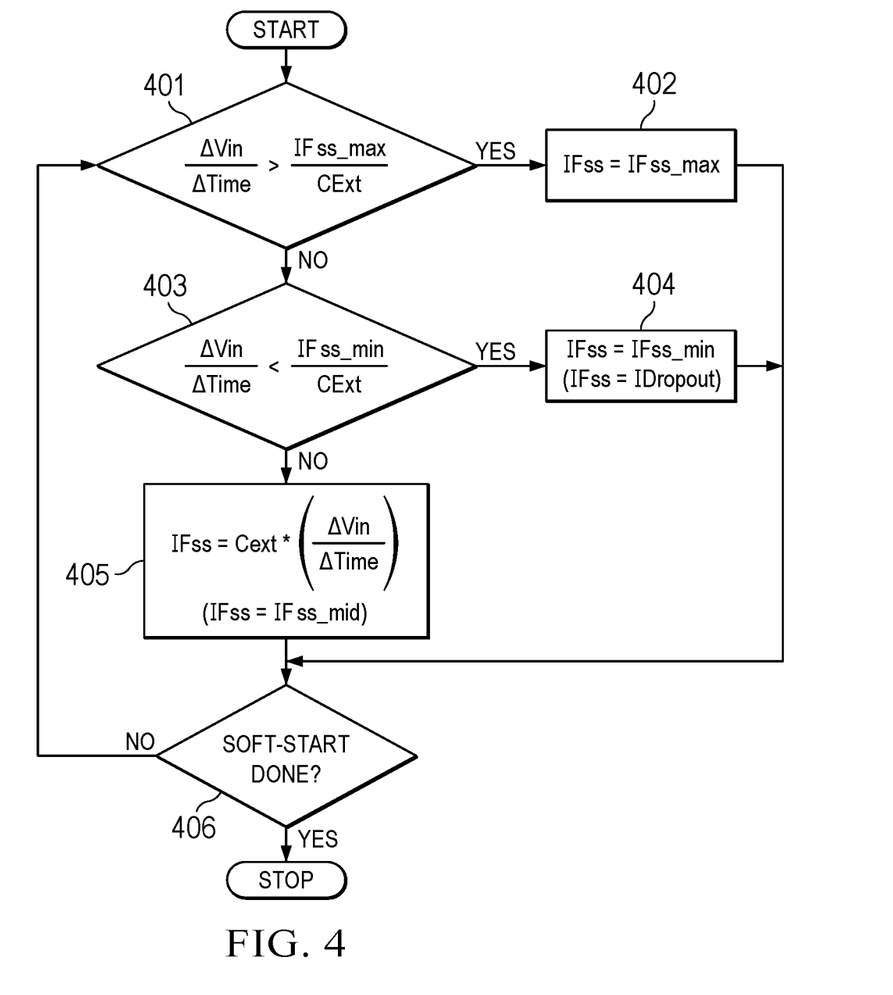
FIG. 4 illustrates a flow diagram showing operation of an LDO voltage regulator, in an example.

The dropout detection circuit 105 is configured to modulate one of the input resistances of the amplifier based on the reference voltage and the transistor gate signal provided by the amplifier, which in turn allows the reference current to be modulated. In general, the reference voltage and the transistor gate signal values effectively allow Vds of the transistor to be determined. The Vds value is indicative the ramp rate of input supply voltage Vin. So, different values of Vds can be used as Vin ramp rate thresholds. For instance, a first (relatively high) Vds value can be used to indicate a relatively fast Vin ramp rate, and a second (relatively low) Vds value can be used to indicate a relatively slow Vin ramp rate. In an example operation, during initial start-up or dropout, the dropout detection circuit 105 can modulate the input resistance value of the amplifier (and thus the soft-start reference current) based on a drain-to-source voltage (Vds) of the passFET of the VRef circuit 103. In this manner, the LDO voltage regulator 101 regulates Vout based on the reference voltage, rather than directly based on the output voltage Vout itself. Examples of a dropout detection circuit 105 are shown in FIGS. 3 and 4 and described below. More generally, the dropout detection circuit 105 can be implemented with any dropout detection circuit configurations capable of modulating the reference current provided by a reference voltage generation circuit.

The LDO core 104 is configured to provide a regulated voltage output Vout based on the input supply voltage Vin and the reference voltage signal provided by the VRef circuit 103. In an example, the LDO core 104 includes a switching element (also called a pass element) such as a passFET, and an amplifier having a unity gain configuration for gating the switching element. One example of a LDO core 104 is shown in FIGS. 2 and 3 and described below. More generally, the LDO core 104 can be implemented with any LDO core configurations capable of generating a regulated output voltage based on an input supply voltage Vin and a reference voltage signal provided by a reference voltage generation circuit.

FIG. 2 is a schematic diagram illustrating example features of LDO voltage regulator 101. As shown, the LDO voltage regulator 101 includes V2I circuit 102, VRef circuit 103, dropout detection circuit 104, and LDO core 105. The above relevant description with reference to FIG. 1 is equally applicable here. Certain further example implementation details are shown in FIG. 2.

As shown, the V2I circuit 102 in this example is implemented with a current source 200 configured to provide bias current IBias. The current source 200 is based on a bandgap reference voltage (VBG) and resistance (R). As described above, current source 200 can have any number of topologies capable of providing a stable bias current. The IBias current is coupled between ground and the non-inverting input of the VRef circuit 103. The absolute value of the current source 200 can vary from one embodiment to the next, but in some example cases is in the range of 1 milliamp to 50 milliamps (mA). In some examples, the current source 200 is fixed. In other examples, the current source 200 may be user-configurable or otherwise adjustable thus allowing bias current IBias to be set to a desired value.

The VRef circuit 103 of this example includes an amplifier 201 having a first input (non-inverting), a second input (inverting), and an output. The first input of the amplifier 201 is coupled to a power supply node (to which Vin is connected) via a first resistance R1, and the second input of the amplifier 201 is coupled to the power supply node via a second resistance R2. The VRef circuit 103 further includes a transistor Q1, which is a p-type FET (PFET) in this example, and has a gate, a source, and a drain. The Q1 gate is coupled to the output of the amplifier 201, the Q1 source is coupled to the second (inverting) input of the amplifier 201, and the Q1 drain is coupled to a reference voltage node. In this example, the reference voltage node is connected to ground via the parallel combination of an external reference resistor RExt and an external capacitor CExt. In such a case, resistor RExt and capacitor CExt may be user-configurable, to set a desired VRef value. In other examples, this resistor and capacitor arrangement may be internal to the VRef circuit 103, or some other part of regulator 101. In still other examples, there may be no capacitor, which is used to filter reference noise. In any such cases, with the IBias current applied, a reference current IRef is generated and flows through transistor Q1 and RExt, thereby causing a reference voltage (VRef) at the reference voltage node. The reference current IRef can be computed as IBias*[R1/R2]. As further shown, the resistance R2 can be varied by the dropout detection circuit 105, responsive to the gate potential of Q1 and the VRef potential at the reference voltage node. In this manner, the reference current IRef may be dynamically adjusted to a fast soft-start current IFss during initial start-up of regulator 101 and dropout periods.

The LDO core 104 of this example includes a unity gain buffer 202 and a pass element QPass. The pass element QPass in this example is a PFET (e.g., power PFET), which has its source coupled to the power supply node, and its drain coupled to ground via an output resistance R3. The unity gain buffer 202 has its inverting input coupled to the reference voltage node, its non-inverting input connected to the drain of the pass element, and its output coupled to the gate of the pass element QPass. In this manner, the LDO core 104 is configured to provide the output voltage Vout to the output voltage node responsive to output of the unity gain buffer 202. Other LDO core configurations can be used and may include additional componentry and/or different topologies that can also benefit from the techniques described herein.

FIG. 3 is a schematic diagram illustrating example features of LDO voltage regulator 101. As shown, the LDO voltage regulator 101 includes V2I circuit 102, VRef circuit 103, dropout detection circuit 104, and LDO core 105. The above relevant description with reference to FIGS. 1 and 2 is equally applicable here. Certain further example implementation details are shown in FIG. 3 with respect to the V2I circuit 102 and the dropout detection circuit 105.

As shown, the V2I circuit of this example is implemented with a voltage-to-current converter circuit that includes a bandgap voltage reference (BGVR) 301, an operational amplifier 302, a transistor Q2, and resistance R4. The BGVR 301 is configured to provide a stable voltage reference to the input of amplifier 302 and can be implemented with any number of standard or proprietary bandgap voltage reference circuit topologies, such as Brokaw, Widlar, and switched capacitor topologies. In this example, the amplifier 302 has a voltage follower configuration, with its inverting input tied to its output, and receives the output voltage VBgvr of BGVR 301 at its non-inverting input. The output of the amplifier 302 drives the gate of transistor Q2, which in this example is an n-type FET (NFET). The current in resistor R4 is about equal to VBgvr/R4 and flows from the source to drain of transistor Q2, thereby providing the current IBias, which in this example is applied to the non-inverting input of amplifier 201, to help generate the reference current IRef.

The VRef circuit 103 and the LDO core 104 of FIG. 3 are implemented in a similar fashion to that shown in FIG. 2, and that above relevant description is equally applicable here.

As further shown in FIG. 3, the dropout detection circuit 105 includes transistors Q3 through Q10, resistances RRamp, RDrop, and R5, and current source I1. Other examples may have additional components and/or be implemented with different components and/or arranged in a different fashion, but still provide a comparable function of modulating the value of resistance R2 based on the potential VRef at the reference voltage node and the gate potential of transistor Q1. Such an arrangement allows the regulator to be regulated based on the reference voltage rather than the output voltage.

In this example: transistor Q3 is an NFET having its gated coupled to the reference voltage node of the VRef circuit 103 and its drain coupled to the power supply node Vin; and transistor Q4 is a PFET having its gate coupled to the gate of Q1 and its source coupled to the source of transistor Q3 via resistance RRamp. The current IRamp passes through resistance RRamp. Also in this example: transistor Q5 is a PFET having its drain coupled to its gate and resistance RDrop and its source coupled to the Q3 drain; and transistor Q6 is a PFET having its gate coupled to the Q5 drain via resistance RDrop and its drain coupled to the inverting input of the amplifier 201.

Transistor Q6 is connected in parallel with resistor R2, thus effectively allowing the value of R2 to be modulated. In more detail, and as shown in this example, the Q6 drain is coupled to the power supply node via resistance R5. So, transistor Q6 is connected in parallel with at least one resistor (R2) making up the overall input resistance at the inverting input of amplifier 201. Also in this example, transistor Q6 is connected in series with at least one other resistor (R5) making up the overall input resistance at the inverting input of amplifier 201. The drain-to-source resistance (RdsOn) of Q6 may also contribute to the overall input resistance at the inverting input of amplifier 201. Thus, depending on the Q6 gate signal, the overall input resistance at the inverting input of amplifier 201 can be determined by: R2*(R5+RdsOn)/[R2+R5+RdsOn]. In this manner, the value of R2 is effectively modulated or otherwise varied by dynamically switching in parallel resistances. This relationship can be captured as follows:

$$R2'a \frac{1}{(I1 - IRamp) * RDrop}$$

where R2' represents the value of the parallel combination of R2, R5 and the on-resistance of transistor Q6 (RdsOn), I1 is the dropout detector reference bias current (303), IRamp is the current based on the Vin ramp rate, RDrop is the resistance used to develop the voltage for modulating value of R2.

With further reference to FIG. 3, the dropout detection circuit 105 also includes a current source 303 that is coupled to the Q3 drain and the Q5 source, and configured to provide a current I1 to which the current IRamp is compared. In some examples, the current source is a proportional to absolute temperature (PTAT) current source. Also in this example, a first current mirror including Q7 and Q8 is coupled between the Q4 drain and ground, and a second current mirror including Q9 and Q10 is coupled to the Q5 drain via the resistance RDrop and ground. In one such case, a differential current that results from comparing the I1 and IRamp currents effectively determines the modulated value of resistance R2. So, in an example operation, current flowing through RRamp is based on a ramp rate of the input power supply Vin and is compared with current I1, and the resulting differential current flows into the second current mirror of Q9 and Q10, which in turn causes Q6 to conduct thus switching in R5 (and RdsOn) to effectively modulate or vary the value of R2 based on the ramp rate of supply voltage Vin. A relatively high supply ramp rate will yield an IRamp current equal to about 0 A and thus a differential current about equal to current I1, thus dynamically increasing the fast soft-start current IFss to IFss_max. In contrast, a relatively slow supply ramp rate will yield a differential current of about 0 A (I1−IRamp=0 A), thus dynamically decreasing IFss to IFss_min. Intermediate ramp rates will cause a sufficient voltage drop across RDrop, thus dynamically setting the reference current to IFss_mid, which is somewhere between IFss_max and IFss_min.

The dropout detection circuit 105 can, in general, be a digital implementation including standard and/or proprietary functionality, but its operation is extended in an analog manner (using FETs Q3-Q10 and current source 303, in this example) to support input voltage supply ramp controlled fast soft-start current. In more detail, by using transistor Q1, the dropout detection circuit 105 is able to understand the operation of LDO voltage regulator 101 at near-dropout or deep-dropout or normal operation and set the IFSS current accordingly. The gate voltages of transistors Q3 and Q4 facilitate assessing near-dropout operation of regulator 101. The generated differential voltage on resistor RRamp indirectly provides information that is indicative of operation of regulator 101 (e.g., deep-dropout or near-dropout or normal operation). The RRamp voltage drop depends on the ramp rate of the input voltage supply Vin to generate the current IRamp based on the ramp rate of the supply Vin, and that current IRamp flows through transistor Q6 to transistor Q7. The IRamp current is compared with I1 and the differential amount flows into transistor Q9. The current from transistor Q9 mirrored in transistor Q10 is used to develop the gate-to-source voltage (Vgs) drop for transistor Q6 using transistor Q5 and RDrop. The variable voltage drop on resistor RRamp based on the ramp rate of the supply Vin is used to modulate the Vgs drop of transistor Q6 to vary the fast soft-start current IFss depending on the Vin supply ramp rate.

The values of R1, R2, R3, R4, R5, RRamp, RDrop, RExt, CExt, Vin, VBgvr, VRef, Vout, IBias, IRef, IRamp, and I1 can vary from one embodiment to the next. In one example case, R1 is about 1 KΩ, R2 in combination with RdsOn and R5 is in the range of 1KΩ to 60Ω (depending on Vds of Q1), R3 is about 1MΩ, R4 is about 8 KΩ, RRamp is about 35 KΩ, RDrop is about 500 KΩ, RExt is about 22 KΩ, CExt is about 4.7 μF, Vin is about 5 volts, VBgvr is about 1.20 volts, VRef may range from about 0.4 volts to about 3 volts, and the maximum output voltage (Vout) of the LDO core 104 is in the range about 0.1 to 0.5 millivolts less than VRef, IBias is about 150 μA, IRef may range from about 150 μA to about 2 mA (with each of IFss_max, IFss_mid, IFss_min, and Dropout being somewhere in this range), IRamp is about 20 μA, and I1 is about 10 μA. More generally, values of R1, R2, R3, R4, R5, RRamp, RDrop, RExt, CExt, Vin, VBgvr, VRef, Vout, IBias, IRef, IRamp, and I1 can be set to any values suitable for a given application. The techniques described herein can be readily applied to any such configurations. Other variations can be made as well. For instance, a voltage follower configuration with negative feedback driving an NFET may be implemented instead as a voltage follower configuration with negative feedback driving a PFET. Also, couplings between components may include other circuitry that achieves a similar function.

Methodology

FIG. 4 illustrates a flow diagram showing operation of an LDO voltage regulator, in an example. The depicted methodology may be carried out, for example, by LDO voltage regulator 101 or any other LDO voltage regulator configured to generate a reference current and capable of providing fast soft-start current that is controlled based on input voltage supply ramp rate as variously described herein.

The example methodology includes, at 401, comparing the ramp rate of the input supply voltage Vin to a first threshold. The ramp rate is generally designated as ΔVin/ΔTime, and the first threshold is designated as IFss_max/CExt and is indicative of a fast ramp rate. IFss_max is the maximum soft-start current, and CExt is the value of external capacitor used to filter the reference voltage VRef. Responsive to the input supply voltage Vin having a ramp rate that is greater than the first threshold, the methodology includes, at 402, adjusting the fast soft-start current (IFss) to a first fast soft-start current IFss_max. This relatively high current facilitates a faster start-up mode of the LDO regulator. Otherwise, the methodology continues to 403.

At 403, the methodology includes comparing the ramp rate of the input supply voltage Vin to a second threshold. The second threshold is designated as IFss_min/CExt and is indicative of a slow ramp rate. Here, IFss_min is the minimum soft-start current that keeps transistor Q1 in saturation. So, if the Vin ramp rate of the supply is lower than IFss_min/CExt, then transistor Q1 is expected to go into deep triode region. Thus, responsive to the input supply voltage Vin having a ramp rate that is less than the second threshold, the methodology includes, at 404, adjusting the fast soft-start current (IFss) to a second fast soft-start current IFss_min, which can be computed as (Vin−VRef)/R2 and is less than the first fast soft-start current IFss_max. If in dropout mode, the minimum soft-start current (IFss) is referred to as IDropout. In either case, once the threshold VRef voltage is met (e.g., 90% of full VRef), the soft-start mode ends and the LDO regulator eases toward full regulation (e.g., 100% of full VRef) with no or otherwise reduced overshoot. Otherwise, the methodology continues to 405.

At 405, it has been determined that the ramp rate of the input supply voltage Vin is somewhere between the first and second thresholds. In such a case, the methodology includes adjusting the fast soft-start current (IFss) to an intermediate current that is between IFss_max and IFss_min. In this example, IFss is set to: CExt*(ΔVin/ΔTime), also referred to herein as IFss_mid.

At 406 a determination as to whether the soft-start mode process is done. If not, the method continues back to 401 and repeats until the soft-start mode process is done; otherwise the methodology ends and normal regulation ensues. The soft-start mode can be considered done, for instance, when the reference voltage VRef reaches the 90% threshold. So, for instance, if the full VRef value is 3 volts, then the soft-start mode may be considered to be done responsive to VRef reaching about 2.7 volts. Once soft-start mode is done, the LDO regulator operates toward full regulation (e.g., 100% of full VRef) where the normal mode reference current IRef is used.

In some such examples, subsequent to initial power-up of the LDO voltage regulator being complete and responsive to the LDO voltage regulator being in a dropout condition, the methodology includes initially adjusting the reference current to the fast soft-start current IFss_max, and subsequently modulating the reference current downward from the fast soft-start current IFss_max towards the fast soft-start current IFss_min, to reduce overshoot.

In one example scenario, an LDO voltage regulator in which the methodology operates includes a reference voltage generator circuit having a switching element that is gated by an output signal of an amplifier. The amplifier has a first input resistance and a second input resistance, and is configured to generate the reference current based on the first resistance and the second resistance. In one such case, the methodology includes adjusting one of the first resistance or the second resistance based on the reference voltage and the output of an amplifier. In another example scenario, the LDO voltage regulator in which the methodology operates includes a reference voltage generator circuit having a switching element that is responsive to an output signal of an amplifier. In operation, the switching element has a drain-to-source voltage (Vds), and the reference current is adjusted based on Vds.

So, in one example case, if the Vin ramp rate is relatively high, as determined by Vds being greater than Vdsat for transistor Q1 (saturation region of Q1), then a full soft-start current of 2 mA (IFss_max) is allowed to bring up the regulator output in a relatively quick manner. If the Vin ramp rate is relatively slow, as determined by Vds being less than Vdsat for transistor Q1 (triode region of Q1), then a low soft-start current of 150 μA (IFss_min) is allowed as such a current can charge CExt in a relatively efficient manner. If the Vin ramp rate is in between [150 μA/CExt]<dVin/dT<[2 mA/CExt], then the soft start current is regulated between 150 μA and 2 mA (IFss_mid) in an analog manner as described above based on the ramp rate of Vin. In a scenario where the initial power-up of the LDO voltage regulator has completed, and the regulator is in a dropout condition, then the input supply voltage will initially ramp up relatively fast from the dropout condition. In this case, a higher soft-start current (IFss_max) is dynamically engaged as described above to quickly bring the LDO output to or near the regulated value. In one such situation, the initial reference current is set to 2 mA (IFss_max), and then modulated downward towards 150 μA (IFss_min) as VRef approaches nearer to Vin and Vin<Vout (NOM), thereby minimizing overshoot of target output voltage.

Figure 5:
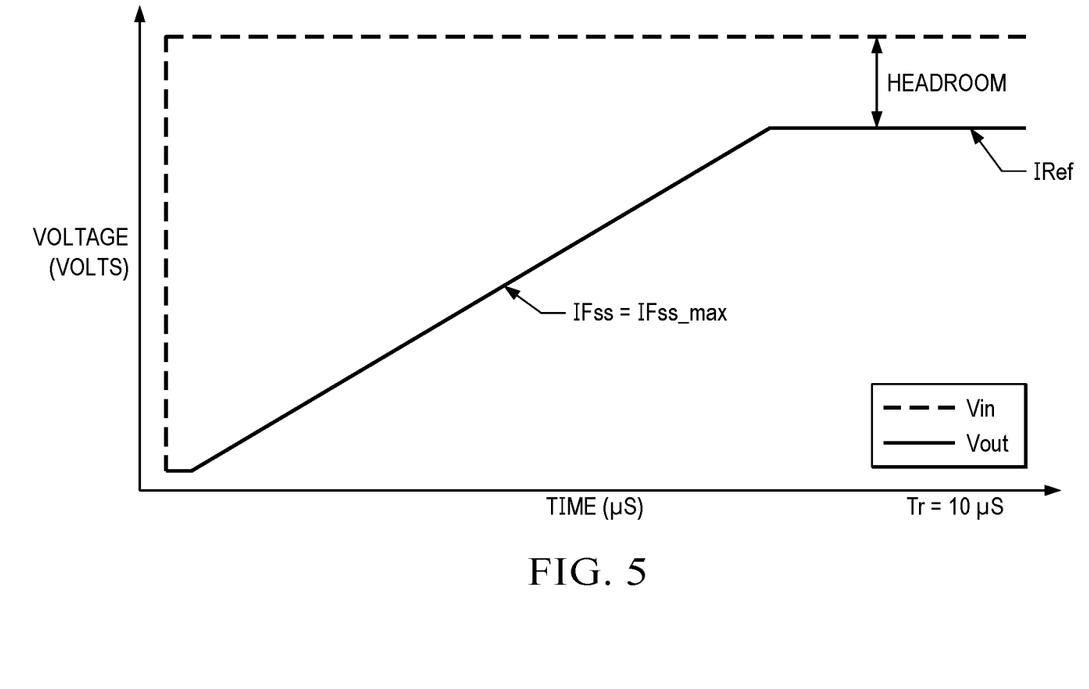
FIGS. 5-8 each illustrates a plot showing performance results of an LDO voltage regulator, in an example.

FIGS. 5-8 each illustrates a plot showing performance results of an LDO voltage regulator, in an example. FIG. 5 shows a very fast Vin ramp rate (as shown in dashed line for Vin), where Vin transitions from 0 volts to its maximum value (e.g., 3 volts) in about 10 microsecond (μS). The transition time is designated as Tr in FIGS. 5-8. In such an example case, the fast soft-start reference current (IFss) is set to IFss_max, and rapidly transitions through IFss_mid and IFss_min to achieve IRef responsive to the reference voltage VRef reaching a suitable threshold (e.g., 90%) of its full value, to reduce any overshoot. The IFss_mid and IFss_min soft-start currents are not visible in this plot, given the fast ramp rate and time-base. So, if full VRef value is 2.5 volts, then transition from soft-start mode to normal regulation by the LDO voltage regulator can begin at around 2.25 volts. The headroom (Vin-Vout) can be quite small, such as less than 1 volt (e.g., under 0.3 volts, such as 0.080 volts).

Figure 6:
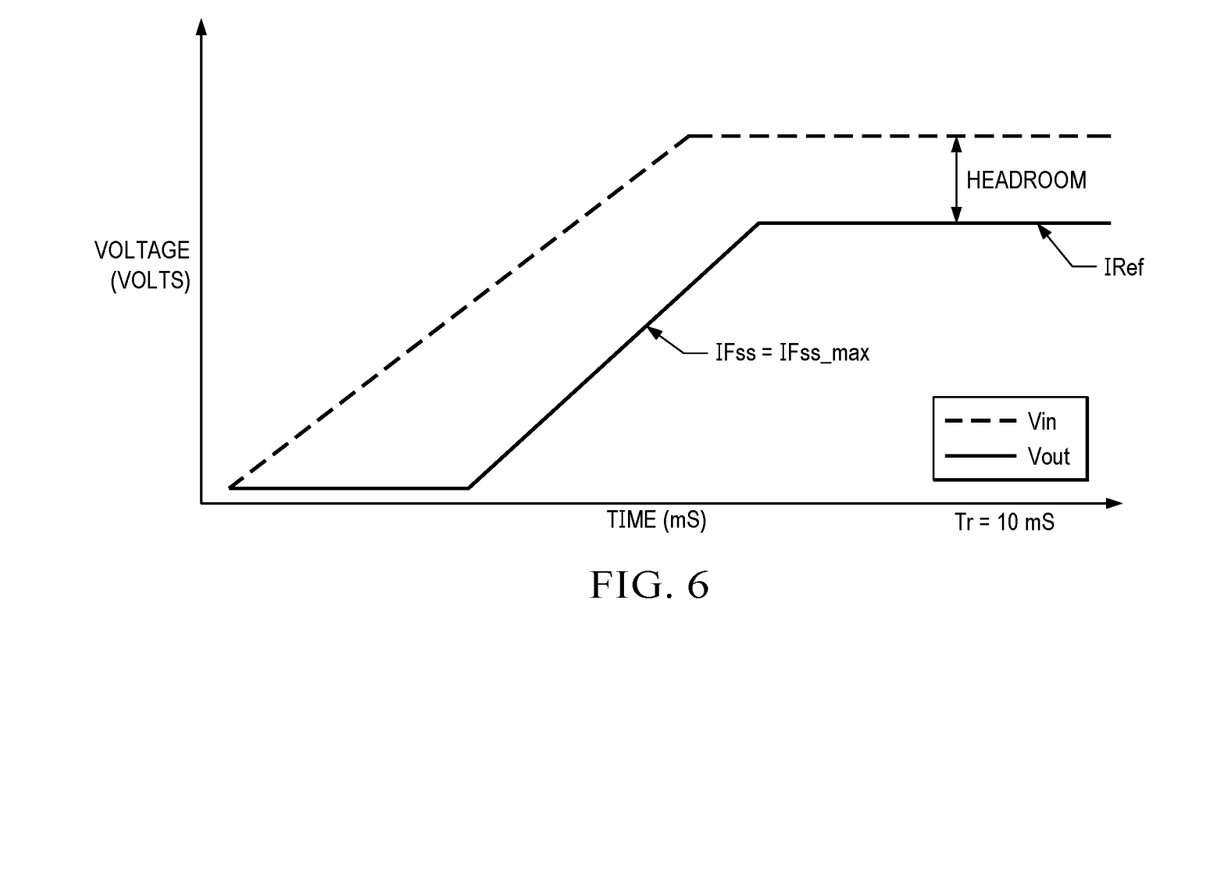

FIG. 6 shows another example of a relatively fast Vin ramp rate (as shown in dashed line for Vin), where Vin transitions from 0 volts to its maximum value (e.g., 3 volts) in about 10 milliseconds (Tr=10 mS). Again, the fast soft-start reference current (IFss) is initially set to IFss_max, and rapidly transitions through IFss_mid and IFss_min to eventually achieve IRef responsive to the reference voltage VRef reaching a suitable threshold (e.g., 90%) of its full value, in a similar fashion to that described with reference to FIG. 5.

Figure 7:
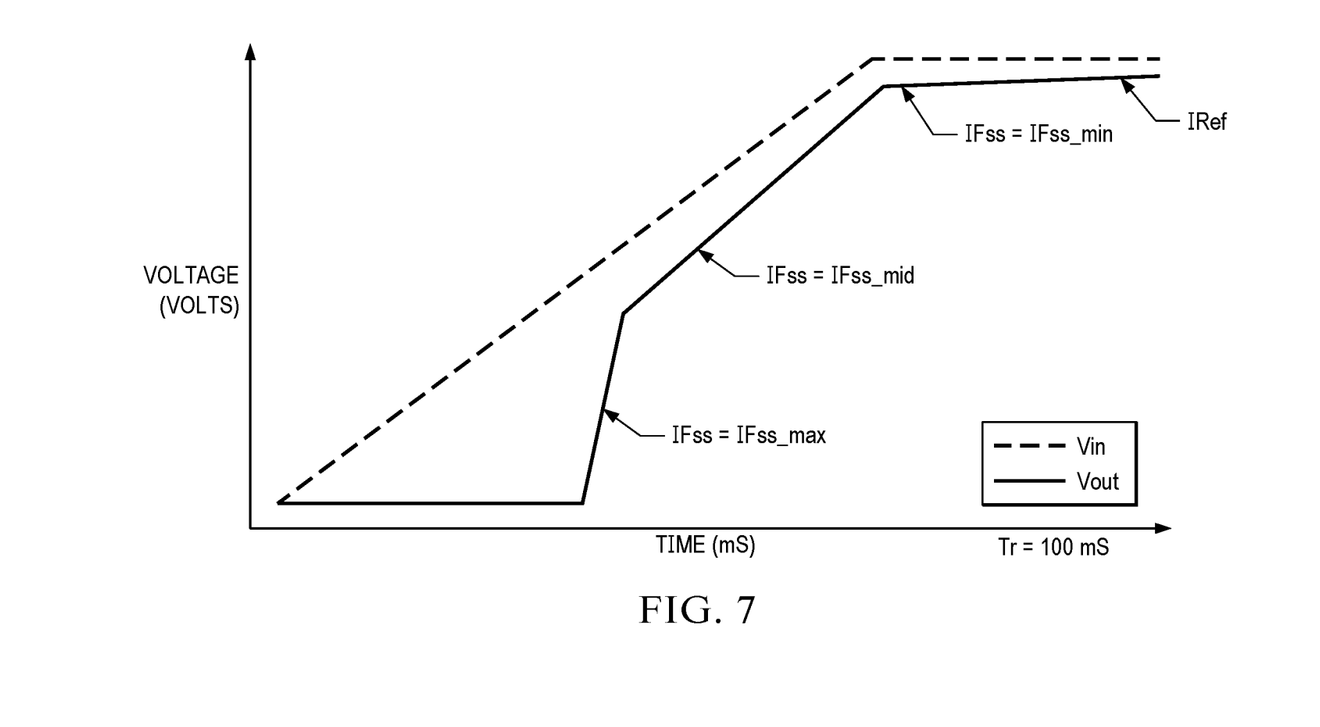

FIG. 7 shows an example of a relatively slow Vin ramp rate (as shown in dashed line for Vin), where Vin transitions from 0 volts to its maximum value (e.g., 3 volts) in about 100 mS. In this example case, assume the delta between Vin and VRef (Vin−VRef) changes from 0.2 volts to 0.6 volts. Responsive to a condition where Vin−VRef is equal to or less than about 0.2 volts, then the LDO is near or in normal regulation and the fast soft-start reference current (IFss) is set IFss_min (low current, just before soft-start mode ends and transition to normal regulation at IRef). Responsive to a condition where Vin−VRef is equal to or greater than about 0.6 volts, then the LDO is in saturation and the fast soft-start reference current (IFss) is set IFss_max (high current). Responsive to a condition where Vin-VRef is between 0.2 volts and 0.6 volts, then the fast soft-start reference current (IFss) is variable IFss_mid (intermediate current).

Figure 8:
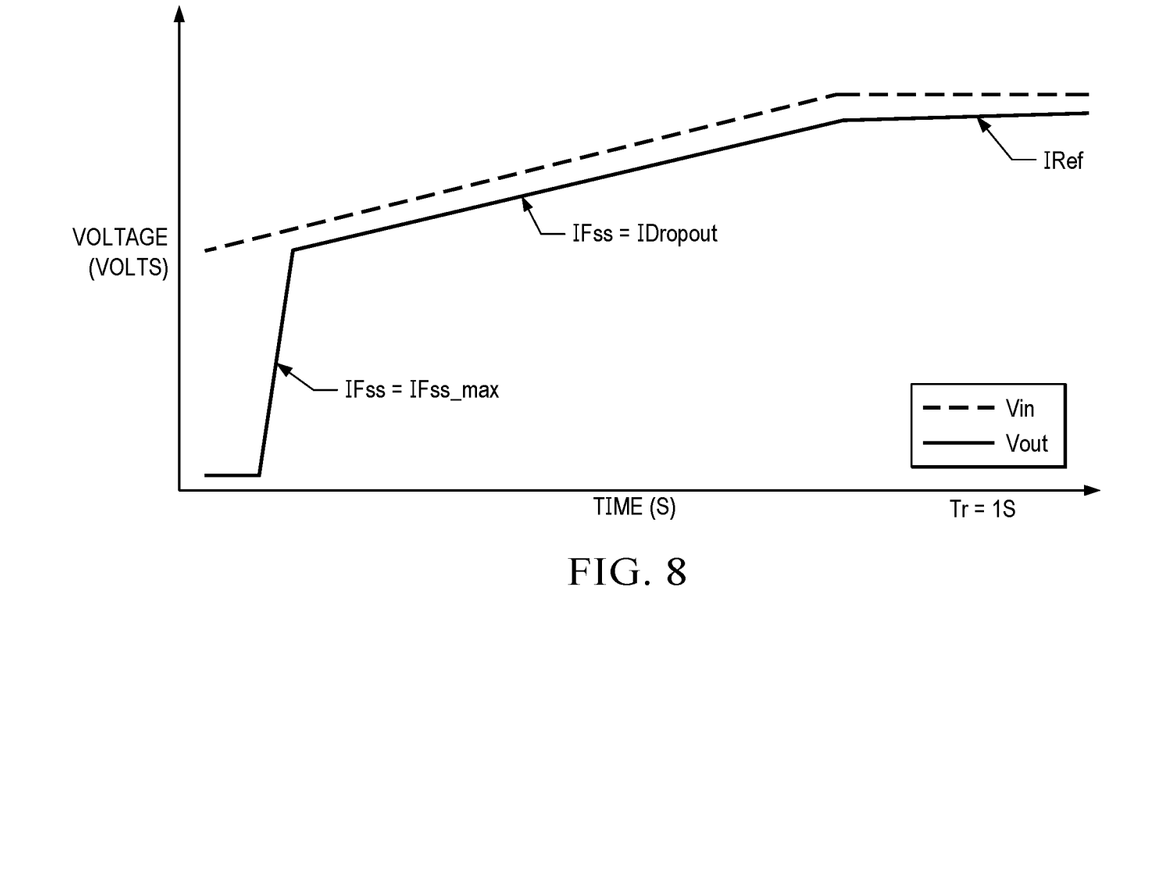

FIG. 8 shows an example dropout condition after initial power-up, where Vin transitions from 0 volts to its maximum value (e.g., 3 volts) in about 1 S. In this case, again assume the delta between Vin and VRef (Vin−VRef)

changes from 0.2 volts to 0.6 volts. Responsive to a condition where Vin−VRef is equal to or greater than about 0.6 volts, then the LDO is in saturation and the fast soft-start reference current (IFss) is set IFss_max. Responsive to a condition where Vin−VRef is equal to or less than about 0.2 volts, then the LDO is in dropout and the fast soft-start reference current (IFss) is set to Dropout (low current, just before soft-start mode ends and the LDO voltage regulator transitions to normal regulation at IRef).

Another possible solution to solve the staircase issue might be to detect the ramp rate of the input supply voltage based on a capacitor coupled from the drain of transistor Q2 and to ground. In such a case, the Vin ramp rate defines the current flowing into and out of that capacitor, which also defines the IFss current. However, such an approach requires an extra capacitor to the V2I circuit. Also, the IFss current will vary with capacitor process variation, and the capacitor size scales with IFss current required, which demands higher area (larger capacitor). Such a capacitor will also degrade the power supply rejection ratio (PSRR), due to additional supply varying current. Moreover, an extra mask layer is needed when fabricating high-voltage capacitors. In contrast, adjusting the fast soft-start current IFss based on the Vds of the transistor Q1 doesn't necessitate an additional capacitor for detecting the Vin ramp rate. The techniques are scalable to high-voltage applications without the need of a high-voltage rated capacitor and may utilize lower area, relative to a capacitor based detection. Moreover, the techniques have little or no effect on PSRR.

FURTHER EXAMPLES

Example 1 is a low-dropout (LDO) voltage regulator circuit. The LDO voltage regulator circuit includes an amplifier and a transistor. The amplifier has a first input, a second input, and an output. The first input of the amplifier is coupled to a power supply terminal via a first resistor, the second input of the amplifier is coupled to the power supply terminal via a second resistor. The transistor has a gate, a source, and a drain. The gate is coupled to the output of the amplifier, the source is coupled to the second input of the amplifier and the second resistor, and the drain is coupled to a reference voltage terminal. Resistance of the second resistor is variable based on a first signal from the output of the amplifier and a second signal from the reference voltage terminal. Each of the first resistor and the second resistor can be one or more resistors and/or resistive elements connected in parallel and/or in series.

Example 2 includes the LDO voltage regulator circuit of Example 1, wherein the reference voltage terminal is coupled to ground via a reference resistor, or a reference resistor and a noise-filtering capacitor coupled in parallel.

Example 3 includes the LDO voltage regulator circuit of Example 1 or 2, wherein the reference resistor and/or the noise-filtering capacitor are external to the LDO voltage regulator circuit.

Example 4 includes the LDO voltage regulator circuit of any one of Examples 1 through 3, and further includes a current source coupled to the first input of the amplifier and the first resistor.

Example 5 includes the LDO voltage regulator circuit of Example 4, wherein the current source includes a voltage-to-current converter circuit having a bandgap voltage reference input.

Example 6 includes the LDO voltage regulator circuit of any one of Examples 1 through 5, and further includes a unity gain buffer and a pass element, the unity gain buffer having an input coupled to the reference voltage terminal, the pass element coupled between the power supply terminal and an output voltage terminal and configured to provide an output voltage to the output voltage terminal responsive to output of the unity gain buffer.

Example 7 includes the LDO voltage regulator circuit of any one of Examples 1 through 6, wherein the transistor is a first transistor, the gate is a first gate, the source is a first source, and the drain is a first drain, the LDO voltage regulator circuit further including: a second transistor having a second gate, a second source, and a second drain, the second gate coupled to the reference voltage terminal, and the second drain coupled to the power supply terminal; and a third transistor having a third gate, a third source, and a third drain, the third gate coupled to the first gate, the third source coupled to the second source via a third resistor, and the third drain coupled to a current mirror.

Example 8 includes the LDO voltage regulator circuit of Example 7, wherein the current mirror is a first current mirror, the LDO voltage regulator circuit further comprising: a fourth transistor having a fourth gate, a fourth source, and a fourth drain, the fourth gate coupled to the fourth drain, and the fourth source coupled to the second drain; a second current mirror coupled to the fourth drain via a fourth resistor; and a proportional to absolute temperature (PTAT) current source coupled to the first and second current mirrors and for providing current I1. In operation, current flowing through the third resistor is based on a ramp rate of an input power supply coupled to the power supply terminal and is compared with current I1, and the resulting differential current flows into the second current mirror which in turn causes the resistance of the second resistor to change in value based on the ramp rate.

Example 9 includes the LDO voltage regulator circuit of Example 8, and further includes a fifth transistor having a fifth gate, a fifth source, and a fifth drain, the fifth gate coupled to the second current mirror and the fourth resistor, and the fifth drain coupled to the second input of the amplifier and the second resistor, the fifth transistor being coupled in parallel with at least one resistor making up the resistance of the second resistor.

Example 10 includes the LDO voltage regulator circuit of Example 9, wherein the fifth transistor is also coupled in series with at least one other resistor making up the resistance of the second resistor.

Example 11 is an integrated circuit comprising the LDO voltage regulator circuit of any one of Examples 1 through 10.

Example 12 is a low-dropout (LDO) voltage regulator circuit, including: a current source configured to provide a bias current; a reference voltage circuit having a transistor that is gated by an output signal of an amplifier configured with an input resistor, the reference voltage circuit configured to provide a reference current based on the input resistor and the bias current; and a dropout detection circuit configured to modulate resistance of the input resistor based on the output signal of an amplifier. The first input resistor can be one or more resistors and/or resistive elements connected in parallel and/or in series.

Example 13 includes the LDO voltage regulator circuit of Example 12, and further includes: a pass element; and an amplifier having a unity gain configuration for gating the pass element.

Example 14 includes the LDO voltage regulator circuit of Example 12 or 13, wherein the reference current is passed through a reference resistor to provide a reference voltage, and the dropout detection circuit is further configured to modulate the resistance of the input resistor based on the reference voltage.

Example 15 is an integrated circuit comprising the LDO voltage regulator circuit of any one of Examples 12 through 14.

Example 16 is a dropout detection circuit for a low-dropout (LDO) voltage regulator. The dropout detection circuit includes: a first transistor having a first gate, a first source, and a first drain, the first gate coupled to a reference voltage terminal, and the first drain coupled to a power supply terminal; a second transistor having a second gate, a second source, and a second drain, the second gate coupled to an amplifier output terminal, the second source coupled to the first source via a first resistor configured to pass a first current; a third transistor having a third gate, a third source, and a third drain, the third drain coupled to the third gate and a second resistor, and the third source coupled to the first drain; a fourth transistor having a fourth gate, a fourth source, and a fourth drain, the fourth gate coupled to the third drain via the second resistor, the fourth source coupled to the power supply terminal via a third resistor, and the fourth drain coupled to an amplifier input terminal, such that the fourth transistor can vary resistance of an amplifier input resistor responsive to signal at the fourth gate; and a proportional to absolute temperature (PTAT) current source coupled to the first drain and the third source and configured to provide a second current to which the first current is compared.

Example 17 includes the dropout detection circuit of Example 16, and further includes: a first current mirror coupled to the second drain; and a second current mirror coupled to the third drain via the second resistor.

Example 18 includes the dropout detection circuit of Example 16 or 17, wherein a differential current that results from comparing the first and second currents causes the resistance of the amplifier input resistor to change in value.

Example 19 is an integrated circuit comprising the dropout detection circuit of any one of Examples 16 through 18.

Example 20 is a method for controlling a low-dropout (LDO) voltage regulator configured to generate a reference current. Responsive to an input supply voltage having a ramp rate that is greater than a first threshold that is indicative of a fast ramp rate, the method includes: adjust the reference current to a first fast soft-start current. Responsive to the input supply voltage having a ramp rate that is less than a second threshold that is indicative of a slow ramp rate, the method includes: adjust the reference current to a second fast soft-start current, the second fast soft-start current less than the first fast soft-start current. Responsive to the input supply voltage having a ramp rate that is between the first threshold and the second threshold, the method includes: adjust the reference current to an intermediate fast soft-start current, the intermediate fast soft-start current between the first and second fast soft-start currents.

Example 21 includes the method of Example 20, and further includes: passing the reference current through a resistor to generate a reference voltage.

Example 22 includes the method of Example 21, wherein the resistor is coupled in parallel with a capacitor to filter noise on the reference voltage.

Example 23 includes the method of any one of Examples 20 through 22, wherein the LDO voltage regulator includes a reference voltage generator circuit having a switching element that is gated by an output signal of an amplifier, the amplifier having a first input resistor and a second input resistor and configured to generate the reference current based on the first resistor and the second resistor. In one such example, the method further includes: adjust one of the first resistor or the second resistor based on the reference voltage and the output of an amplifier.

Example 24 includes the method of any one of Examples 20 through 23, wherein the LDO voltage regulator includes a reference voltage generator circuit having a switching element that is responsive to an output signal of an amplifier, and in operation, the switching element has a drain-to-source voltage (Vds), and the reference current is adjusted based on Vds.

Example 25 includes the method of any one of Examples 20 through 24, wherein, subsequent to initial power-up of the LDO voltage regulator being complete and responsive to the LDO voltage regulator being in a dropout condition, the method further includes: initially adjust the reference current to the first fast soft-start current; and subsequently modulate the reference current downward from the first fast soft-start current towards the second fast soft-start current.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end user and/or a third party.

While the use of particular transistors is described herein, other transistors (or equivalent devices) may be used instead. For example, a p-channel field effect transistor (PFET) may be used in place of an n-channel field effect transistor (NFET) with little or no changes to the circuit. Furthermore, other types of transistors may be used (such as bipolar junction transistors (BJTs)). Furthermore, the devices may be implemented in/over a silicon substrate (Si), a silicon carbide substrate (SiC), a gallium nitride substrate (GaN) or a gallium arsenide substrate (GaAs).

References herein to a field effect transistor (FET) being "ON" means that the conduction channel of the FET is present and drain current may flow through the FET. References herein to a FET being "OFF" means that the conduction channel is not present and drain current does not flow through the FET. A FET that is OFF, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A low-dropout (LDO) voltage regulator circuit, comprising:
    an amplifier having a first input, a second input, and an output, the first input of the amplifier coupled to a power supply terminal via a first resistor, the second input of the amplifier coupled to the power supply terminal via a second resistor; and
    a transistor having a gate, a source, and a drain, the gate coupled to the output of the amplifier, the source coupled to the second input of the amplifier and the second resistor, and the drain coupled to a reference voltage terminal;
    wherein resistance of the second resistor is variable based on a first signal from the output of the amplifier and a second signal from the reference voltage terminal.

2. The LDO voltage regulator circuit of claim 1, wherein the reference voltage terminal is coupled to ground via a reference resistor, or a reference resistor and a noise-filtering capacitor coupled in parallel.

3. The LDO voltage regulator circuit of claim 2, wherein the reference resistor and/or the noise-filtering capacitor are external to the LDO voltage regulator circuit.

4. The LDO voltage regulator circuit of claim 1, further comprising a current source coupled to the first input of the amplifier and the first resistor.

5. The LDO voltage regulator circuit of claim 4, wherein the current source comprises a voltage-to-current converter circuit having a bandgap voltage reference input.

6. The LDO voltage regulator circuit of claim 1, further comprising a unity gain buffer and a pass element, the unity gain buffer having an input coupled to the reference voltage terminal, the pass element coupled between the power supply terminal and an output voltage terminal and configured to provide an output voltage to the output voltage terminal responsive to output of the unity gain buffer.

7. The LDO voltage regulator circuit of claim 1, wherein the transistor is a first transistor, the gate is a first gate, the source is a first source, and the drain is a first drain, the LDO voltage regulator circuit further comprising:
    a second transistor having a second gate, a second source, and a second drain, the second gate coupled to the reference voltage terminal, and the second drain coupled to the power supply terminal; and
    a third transistor having a third gate, a third source, and a third drain, the third gate coupled to the first gate, the third source coupled to the second source via a third resistor, and the third drain coupled to a current mirror.

8. The LDO voltage regulator circuit of claim 7, wherein the current mirror is a first current mirror, the LDO voltage regulator circuit further comprising:
    a fourth transistor having a fourth gate, a fourth source, and a fourth drain, the fourth gate coupled to the fourth drain, and the fourth source coupled to the second drain;
    a second current mirror coupled to the fourth drain via a fourth resistor; and
    a proportional to absolute temperature (PTAT) current source coupled to the first and second current mirrors and for providing current I1;
    wherein in operation, current flowing through the third resistor is based on a ramp rate of an input power supply coupled to the power supply terminal and is compared with current I1, and a resulting differential current flows into the second current mirror which in turn causes the resistance of the second resistor to change in value based on the ramp rate.

9. The LDO voltage regulator circuit of claim 8, further comprising:
    a fifth transistor having a fifth gate, a fifth source, and a fifth drain, the fifth gate coupled to the second current mirror and the fourth resistor, and the fifth drain coupled to the second input of the amplifier and the second resistor, the fifth transistor being coupled in parallel with at least one resistor making up the resistance of the second resistor.

10. The LDO voltage regulator circuit of claim 9, wherein the fifth transistor is also coupled in series with at least one other resistor making up the resistance of the second resistor.

11. An integrated circuit comprising the LDO voltage regulator circuit of claim 1.

12. A low-dropout (LDO) voltage regulator circuit, comprising:
    a current source configured to provide a bias current;
    a reference voltage circuit having a transistor that is gated by an output signal of an amplifier, wherein:
        an input resistor includes a first terminal configured to be coupled to a power supply terminal and a second terminal coupled to a first input of the amplifier;
        the transistor is coupled to the input resistor; and
        the reference voltage circuit is configured to provide a reference current based on the input resistor and the bias current; and
    a dropout detection circuit coupled to the reference voltage circuit at the second terminal of the input resistor and configured to modulate resistance of the input resistor based on the output signal of the amplifier.

13. The LDO voltage regulator circuit of claim 12, further comprising: a pass element; and an amplifier having a unity gain configuration for gating the pass element.

14. The LDO voltage regulator circuit of claim 12, wherein the reference current is passed through a reference resistor to provide a reference voltage, and the dropout detection circuit is further configured to modulate the resistance of the input resistor based on the reference voltage.

15. An integrated circuit comprising the LDO voltage regulator circuit of claim 12.

16. A dropout detection circuit for a low-dropout (LDO) voltage regulator, the dropout detection circuit comprising:
a first transistor having a first gate, a first source, and a first drain, the first gate coupled to a reference voltage terminal, and the first drain coupled to a power supply terminal;
a second transistor having a second gate, a second source, and a second drain, the second gate coupled to an amplifier output terminal, the second source coupled to the first source via a first resistor configured to pass a first current;
a third transistor having a third gate, a third source, and a third drain, the third drain coupled to the third gate and a second resistor, and the third source coupled to the first drain;
a fourth transistor having a fourth gate, a fourth source, and a fourth drain, the fourth gate coupled to the third drain via the second resistor, the fourth source coupled to the power supply terminal via a third resistor, and the fourth drain coupled to an amplifier input terminal, such that the fourth transistor can vary resistance of an amplifier input resistor responsive to signal at the fourth gate; and
a proportional to absolute temperature (PTAT) current source coupled to the first drain and the third source and configured to provide a second current to which the first current is compared.

17. The dropout detection circuit of claim 16, further comprising:
a first current mirror coupled to the second drain; and
a second current mirror coupled to the third drain via the second resistor.

18. The dropout detection circuit of claim 16, wherein a differential current that results from comparing the first and second currents causes the resistance of the amplifier input resistor to change in value.

19. An integrated circuit comprising the dropout detection circuit of claim 16.

20. A method for controlling a low-dropout (LDO) voltage regulator configured to generate a reference current, the method comprising:
responsive to an input supply voltage having a ramp rate that is greater than a first threshold that is indicative of a fast ramp rate, adjust the reference current to a first fast soft-start current;
responsive to the input supply voltage having a ramp rate that is less than a second threshold that is indicative of a slow ramp rate, adjust the reference current to a second fast soft-start current, the second fast soft-start current less than the first fast soft-start current; and
responsive to the input supply voltage having a ramp rate that is between the first threshold and the second threshold, adjust the reference current to an intermediate fast soft-start current, the intermediate fast soft-start current between the first and second fast soft-start currents.

21. The method of claim 20, further comprising: passing the reference current through a resistor to generate a reference voltage.

22. The method of claim 21, wherein the resistor is coupled in parallel with a capacitor to filter noise on the reference voltage.

23. The method of claim 20, wherein the LDO voltage regulator includes a reference voltage generator circuit having a switching element that is gated by an output signal of an amplifier, the amplifier having a first input resistor and a second input resistor and configured to generate the reference current based on the first resistor and the second resistor, the method further comprising: adjust one of the first resistor or the second resistor based on the reference voltage and the output of an amplifier.

24. The method of claim 20, wherein the LDO voltage regulator includes a reference voltage generator circuit having a switching element that is responsive to an output signal of an amplifier, and in operation, the switching element has a drain-to-source voltage (Vds), and the reference current is adjusted based on Vds.

25. The method of claim 20, wherein, subsequent to initial power-up of the LDO voltage regulator being complete and responsive to the LDO voltage regulator being in a dropout condition, the method further comprising:
initially adjust the reference current to the first fast soft-start current; and
subsequently modulate the reference current downward from the first fast soft-start current towards the second fast soft-start current.

* * * * *